US009609750B2

(12) United States Patent
Kanzaki

(10) Patent No.: US 9,609,750 B2
(45) Date of Patent: Mar. 28, 2017

(54) PACKAGE SUBSTRATE AND ELECTRONIC DEVICE

(71) Applicant: Renesas Electronics Corporation, Kanagawa (JP)

(72) Inventor: Shingo Kanzaki, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 931 days.

(21) Appl. No.: 13/930,616

(22) Filed: Jun. 28, 2013

(65) Prior Publication Data
US 2014/0060912 A1    Mar. 6, 2014

(30) Foreign Application Priority Data

Aug. 28, 2012  (JP) .................................. 2012-187906

(51) Int. Cl.
| H05K 1/11 | (2006.01) |
| H05K 7/00 | (2006.01) |
| H01L 23/498 | (2006.01) |
| H01L 23/50 | (2006.01) |
| H05K 3/00 | (2006.01) |

(52) U.S. Cl.
CPC ........ *H05K 1/112* (2013.01); *H01L 23/49811* (2013.01); *H01L 23/49838* (2013.01); *H01L 23/49861* (2013.01); *H01L 23/50* (2013.01); *H01L 2924/0002* (2013.01); *H05K 3/0005* (2013.01); *H05K 2201/09227* (2013.01); *H05K 2201/10734* (2013.01)

(58) Field of Classification Search
CPC ................. H05K 1/112; H05K 3/0005; H05K 2201/09227; H05K 2201/10734

USPC ................................... 174/261, 262; 361/777
See application file for complete search history.

(56) References Cited

U.S. PATENT DOCUMENTS

| 6,285,560 | B1 * | 9/2001 | Lyne ................. H01L 23/49811 174/260 |
| 6,664,483 | B2 | 12/2003 | Chong et al. |
| 7,009,115 | B2 | 3/2006 | Seaman et al. |
| 2002/0172026 | A1 * | 11/2002 | Chong .............. H01L 23/49838 361/777 |
| 2013/0039026 | A1 * | 2/2013 | Lee ...................... H05K 3/3452 361/768 |

FOREIGN PATENT DOCUMENTS

JP    2005-515612    5/2005

OTHER PUBLICATIONS

JP Office Action dated Aug. 25, 2015, with English translation; Application No. 2012-187906.

* cited by examiner

*Primary Examiner* — Sherman Ng
(74) *Attorney, Agent, or Firm* — Young & Thompson

(57) ABSTRACT

In a package substrate, adjacent bumps in a first array of bumps being an outermost array arranged along a first side of the package substrate are arranged being shifted in a first axial direction that is a normal direction of the first side and in a second axial direction that intersects perpendicularly with the first axial direction in a plan view. Adjacent bumps in a second array of bumps arranged in the inside of the first array of bumps are arranged being shifted in the first axial direction and in the second axial direction in a plan view.

11 Claims, 9 Drawing Sheets

FIG. 16

| | NUMBER OF BUMPS EXTRACTABLE PER UNIT AREA (1/mm$^2$) |
|---|---|
| 0.8 mm PITCH (FIG. 7) | 1.75 |
| 0.5 mm PITCH (FIG. 8) | 1.55 |
| US7009115 (FIG. 9) | 1.71 |
| V-SHAPE (FIG. 4) | 1.78 |
| W-SHAPE (FIG. 3) | 1.80 |
| U-SHAPE (FIG. 5) | 1.57 |
| M-SHAPE (FIG. 6) | 1.41 |

FIG. 17

| | NUMBER OF BUMPS EXTRACTABLE PER UNIT LENGTH (1/mm) |
|---|---|
| 0.8 mm PITCH (FIG. 7) | 2.46 |
| 0.5 mm PITCH (FIG. 8) | 2.00 |
| US7009115 (FIG. 9) | 3.19 |
| V-SHAPE (FIG. 4) | 3.17 |
| W-SHAPE (FIG. 3) | 3.33 |
| U-SHAPE (FIG. 5) | 3.65 |
| M-SHAPE (FIG. 6) | 3.98 |

PACKAGE SUBSTRATE AND ELECTRONIC DEVICE

CROSS-REFERENCE TO RELATED APPLICATIONS

The disclosure of Japanese Patent Application No. 2012-187906 filed on Aug. 28, 2012 including the specification, drawings and abstract is incorporated herein by reference in its entirety.

BACKGROUND

The present invention relates to a package substrate and an electronic device, for example, to a package substrate having a bump and an electronic device having the package substrate.

An arrangement of the bumps of the package substrate mounted over a mounting substrate is decided by a design rule of a diameter of a via formed in the mounting substrate, a diameter of a pad to which the bump in the mounting substrate is electrically coupled, a space of the adjacent vias, a space of the via and wiring, a space of the adjacent via and the pad, a space of the adjacent bumps, etc.

Although miniaturization of the electronic device is demanded in recent years, making a value of the design rule small has a limit technologically. Therefore, it is necessary to design an arrangement of the bumps of the package substrate, the vias and pads of the mounting substrate, and wiring so as to satisfy the demand of the miniaturization of the electronic device within a limit of the design rule. At this time, it is necessary to design so that the arrangement may enable a signal to be outputted to the outside of the mounting substrate from all the pads through extraction wiring and to be inputted from the outside to all the pads.

In a package substrate of U.S. Pat. No. 7,009,115, bumps are arranged in a grid form, and predetermined bumps in the array of bumps being an outermost array are thinned out. Since no pads are arranged in an area of the mounting substrate corresponding to thinned-out bumps, pieces of the extraction wiring are extracted into this void area from the pads arranged in the inside of the mounting substrate. This secures an extraction area of the extraction wiring from the pads arranged in the in side of the mounting substrate.

SUMMARY

Arrangement of bumps of an electronic device needs a further contrivance so that it can contribute to miniaturization of the electronic device. Other problems and new features will become clear from description and accompanying drawings of this specification.

In the package substrate according to one aspect of this invention, adjacent bumps in a first array of bumps being an outermost array arranged along a first side of the package substrate are arranged being shifted in a first axial direction that is a normal direction of the first side and in a second axial direction that intersects perpendicularly with the first axial direction in a plan view, and adjacent bumps in a second bump arranged in the inside of the first array of bumps are arranged being shifted in the first axial direction and in the second axial direction in a plan view.

In the package substrate according to another aspect of this invention, a line connecting centers of the multiple bumps in the first array of bumps being the outermost array forms a continuous uneven shape in a plan view, and a line connecting centers of the multiple bumps in the second array of bumps arranged in the inside of the first array of bumps forms a continuous uneven shape in a plan view.

The electronic device according to still another aspect of this invention has the above-mentioned package substrate and a mounting substrate over which the pads are arranged so as to correspond to the bumps of the package substrate.

It can contribute to the miniaturization of the electronic device.

BRIEF DESCRIPTION OF THE DRAWINGS

FIG. 16 is a table showing the number of pads (bumps) per unit area that can be extracted from an upper surface and an undersurface of the mounting substrate of the embodiment, and the number of pads (bumps) per unit area that can be extracted from the upper surface and the undersurface of the mounting substrate of the comparative example; and FIG. 17 is a table showing the number of pads (bumps) per unit length that can be extracted from the upper surface of the mounting substrate of the embodiment, and the number of pads (bumps) per unit length that can be extracted from the upper surface of the mounting substrate of the comparative example.

DETAILED DESCRIPTION

Hereinafter, package substrates and electronic devices of embodiments will be described. However, modes that carry out the invention are not necessarily limited to the following embodiments. Moreover, in order to make the explanation clear, the following descriptions and drawings are simplified appropriately.

First Embodiment

A package substrate and an electronic device of a first embodiment will be described. In the electronic device of this embodiment, as shown in FIG. 1, a package substrate 1 is mounted over a mounting substrate 2, and a bump (e.g., a solder ball) 3 of the package substrate 1 and a pad (e.g., an electrode pad) 4 of the mounting substrate 2 are electrically coupled.

Figure 2:
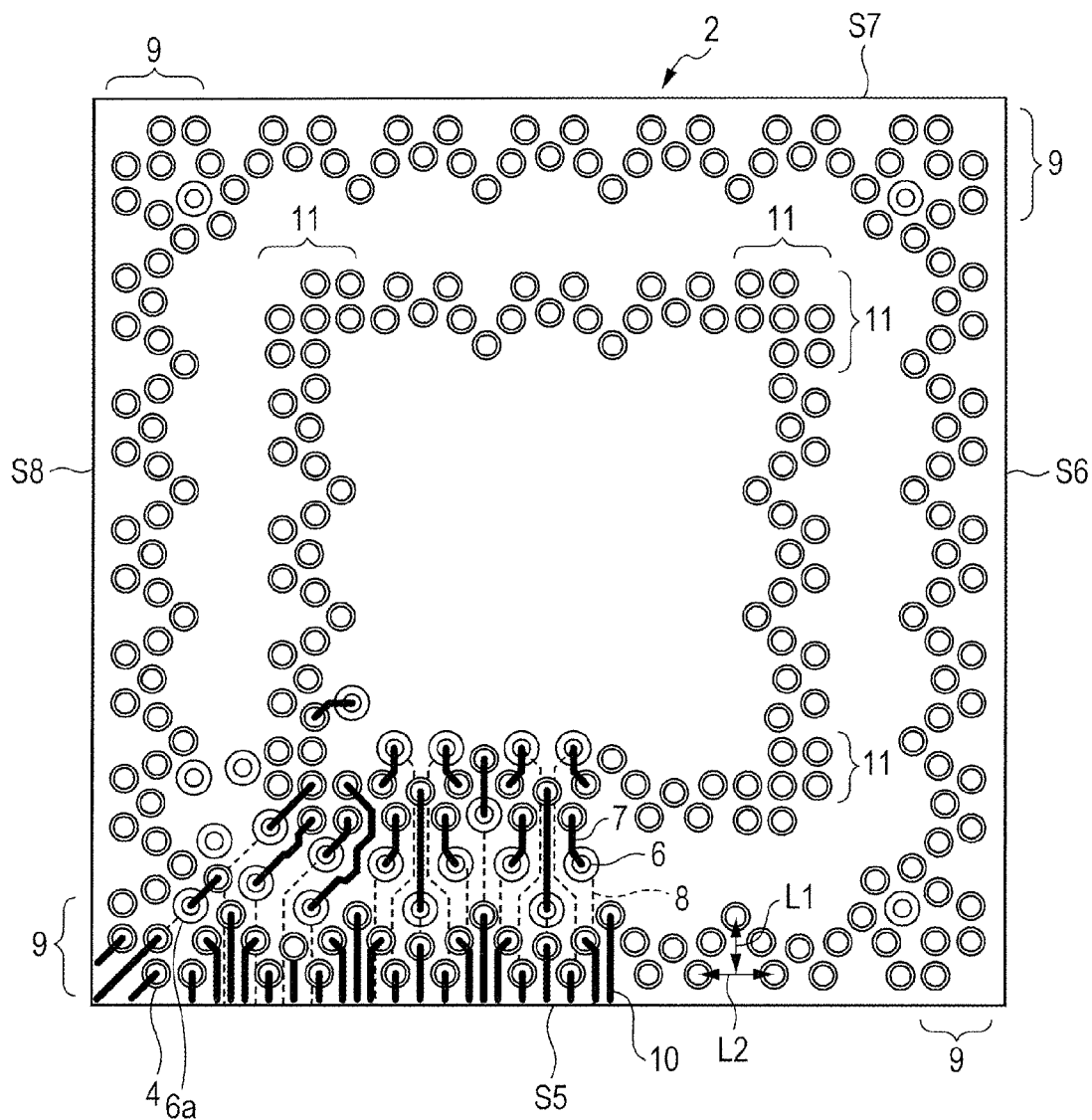
FIG. 2 is a plan view that partially shows a mounting substrate according to the first embodiment, and schematically shows it by partially omitting vias and wiring.
Figure 2:
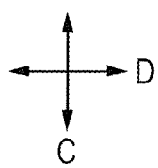

First, the package substrate 1 will be explained in detail. Incidentally, an arrangement of the bumps 3 of the package substrate 1 corresponds to an arrangement of the pads of the mounting substrate 2. Therefore, the package substrate 1 will be explained while using FIG. 2 schematically showing an upper surface of the mounting substrate 2. Incidentally, FIG. 2 shows the vias and the wiring of the mounting substrate 2 by partially omitting them since it will become complicated if all the vias and the whole wiring are shown.

Although an illustration of the package substrate 1 is omitted, a semiconductor chip is mounted over one major surface (the upper surface of this embodiment) thereof, and is covered with a mold material. As shown in FIG. 1 and as can be understood from FIG. 2, the package substrate 1 has an array of bumps 5 being an outermost array arranged along a side of the package substrate 1. The adjacent bumps 3 in the array of bumps 5 are arranged being shifted in a first axial direction that is a normal direction to the side in a plan view and in a second axial direction that intersects perpendicularly with the first axial direction, that is, so as not to overlap each other.

Figure 1:
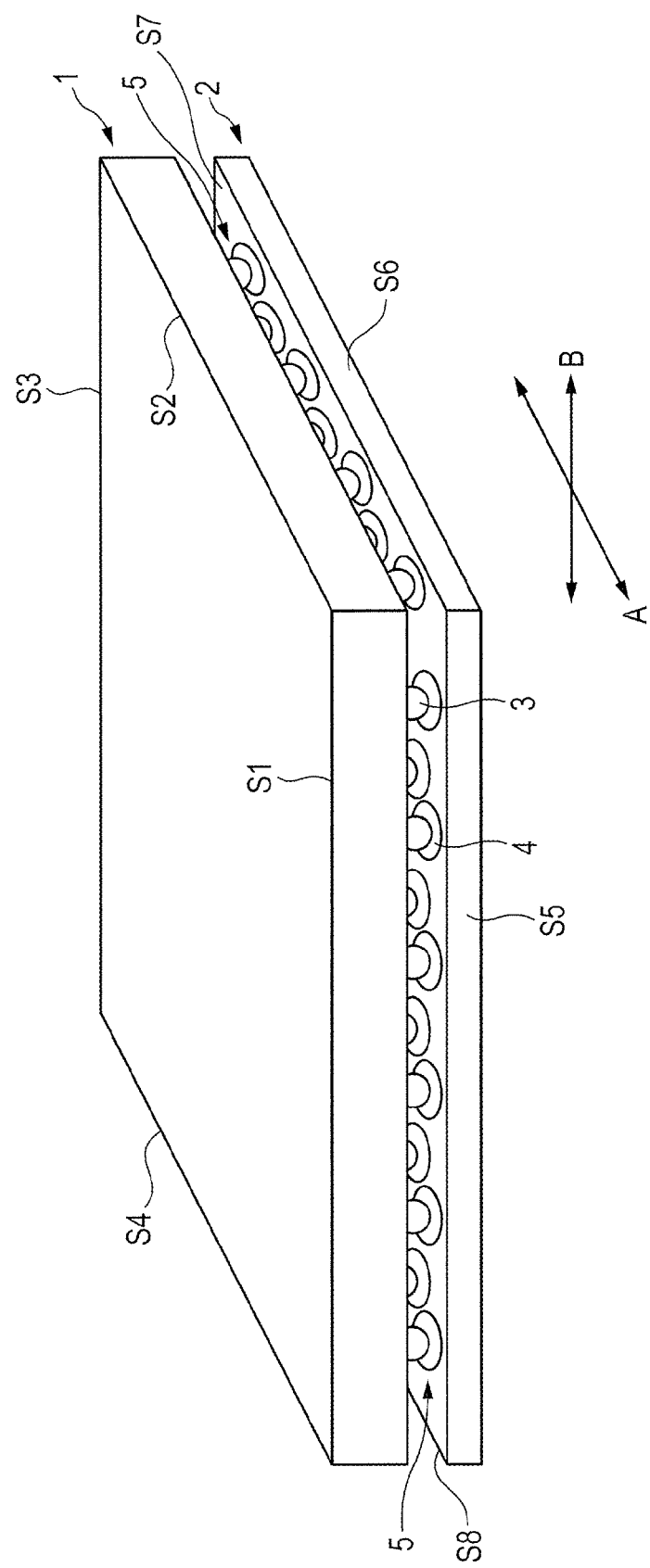
FIG. 1 is a three-dimensional perspective view roughly showing an electronic device according to a first embodiment.

Here, as shown in FIG. 1 and as can be understood from FIG. 2, the package substrate 1 of this embodiment is of a rectangular shape in a plan view. That is, the package substrate 1 has a first side S1, a second side S2, a third side S3, and a fourth side S4, in which the first side S1 and the third side S3 are arranged substantially in parallel, and the second side S2 and the fourth side S4 are arranged substantially in parallel. In addition, the first side S1 and the second side S2 are arranged so as to intersect perpendicularly with each other.

At this time, if being based on the first side S1 and the third side S3, the above-mentioned first axial direction will be a direction A in FIG. 1, and the second axial direction will be a direction B in FIG. 1. On the other hand, if being based on the second side S2 and the fourth side S4, the above-mentioned first axial direction will be the direction B in FIG. 1, and the second axial direction will be the direction A in FIG. 1.

Therefore, in this embodiment, as can be understood from FIG. 2, the array of bumps 5 is arranged along each of the sides S1, S2, S3, and S4, and the adjacent bumps 3 in each array of bumps 5 will be arranged being shifted in the direction A and in the direction B.

Here, since the bumps 3 of this embodiment take an intensive arrangement in a corner of the package substrate 1, they are arranged in consideration of extraction of the wiring of the mounting substrate 2 over which the package substrate 1 is mounted and an arrangement of the vias. For example, as shown in FIG. 2, the bumps 3 of the package substrate 1 are arranged so that a periphery of the via 6a in a corner of the mounting substrate 2 may be surrounded by five or more pads 4. This arrangement enables the pad to be arranged between the adjacent vias, making it possible to make a space of the adjacent vias larger.

A straight line connecting centers of the multiple bumps 3 in the array of bumps 5 forms a continuous uneven shape. Here, the convex portion of this embodiment is made into an approximately V-shape, and the adjacent convex portions differ from each other in a length in the direction A and in a length in the direction B. Therefore, the adjacent convex portions differ from each other in size, and a large convex portion and a small convex portion continue alternately. Incidentally, the approximately V-shape shall include not only the shape formed by straight lines intersecting but also a shape formed by curvilinear lines intersecting.

Incidentally, in this specification, in order to clarify the explanation, a shape formed by a straight line connecting centers of multiple bumps in the array of bumps and a shape formed by a straight line connecting centers of multiple pads in the array of pads may be explained as the approximately V-shape, an approximately U-shape, and an approximately M-shape. These shapes are shapes checked visually from the inside of the electronic device.

The package substrate 1 further has an array of bumps arranged in the inside of the array of bumps 5. Adjacent bumps in this array of bumps are also arranged being shifted in the first axial direction that is a normal direction to the side in a plan view and in the second axial direction that intersects perpendicularly with the first axial direction.

That is, in this embodiment, as can be understood from FIG. 2, the array of bumps is arranged in the inside of each array of bumps 5, and the adjacent bumps in each array of bumps are arranged being shifted in the direction A and in the direction B. A straight line connecting centers of the multiple bumps in the array of bumps arranged in the inside of the array of bumps 5 forms a continuous uneven shape. Here, the convex portion of this embodiment is made into the approximately V-shape, and the adjacent convex portions differ from each other in the length in the direction A and in the length in the direction B.

The array of bumps 5 and the array of bumps arranged in the inside of the array of bumps 5 are arranged so as to correspond to each other. That is, the straight line connecting the centers of the multiple bumps 3 in the array of bumps 5 and a straight line connecting centers of the multiple bumps arranged in the inside of the array of bumps 5 have a substantially equal distance from each other in the first axial direction in any place.

Figure 3:
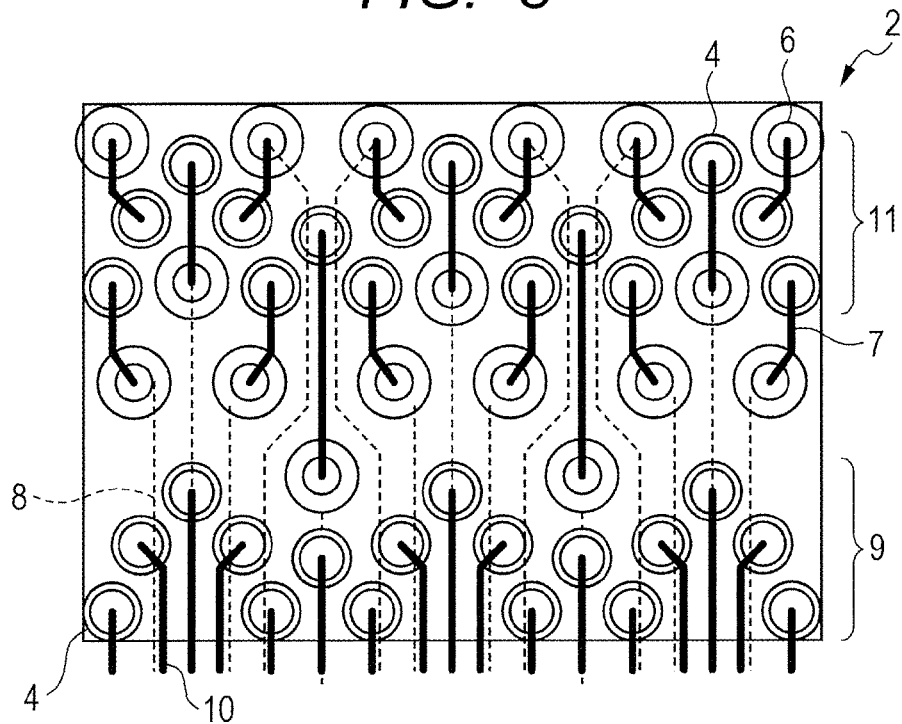
FIG. 3 is a plan view partially showing the mounting substrate according to the first embodiment.

Next, the mounting substrate 2 will be explained in detail. The mounting substrate 2 is, for example, a multilayer interconnection substrate, and has the pads 4 over one major surface (in this embodiment, over the upper surface) so that they may correspond to the bumps 3 of the package substrate 1. Moreover, the mounting substrate 2 has vias 6 as shown in FIG. 2 and FIG. 3, and the via 6 is electrically coupled with a predetermined pad 4 through wiring 7 over the one major surface (in this embodiment, over the upper surface) of the mounting substrate 2. Moreover, the via 6 is electrically coupled with extraction wiring 8 over the other major surface (in this embodiment, over the undersurface) of the mounting substrate 2. The extraction wiring 8 is extending toward the outside of the mounting substrate 2, and has reached, for example, the periphery of the mounting substrate 2.

Furthermore, arrangements of the pad 4 and the via 6 will be explained in detail. The pads 4 are arranged so as to correspond to the bumps 3 of the package substrate 1, as described above. In detail, the mounting substrate 2 has an array of pads 9 so that it may correspond to each array of bumps 5 of the package substrate 1, and the array of pads 9 is an array of pads being an outermost array of pads arranged along the side of the mounting substrate 2. The adjacent pads 4 in the array of pads 9 are arranged being shifted in the first axial direction that is a normal direction to the side in a plan view and in the second axial direction that intersects perpendicularly with the first axial direction.

Here, as shown in FIG. 2, the mounting substrate 2 of this embodiment is of a rectangular shape in a plan view. That is, the mounting substrate 2 has a first side S5, a second side S6, a third side S7, and a fourth side S8, in which the first side S5 and the third side S7 are arranged substantially in parallel, and the second side S6 and the fourth side S8 are arranged substantially in parallel. Moreover, the first side S5 and the second side S6 are arranged so as to intersect substantially perpendicularly with each other.

At this time, if being based on the first side S5 and the third side S7, the above-mentioned first axial direction will be the direction C in FIG. 2, and the second axial direction will be the direction D in FIG. 2. On the other hand, if being based on the second side S6 and the fourth side S8, the above-mentioned first axial direction will be the direction D in FIG. 2, and the second axial direction will be the direction C in FIG. 2. The direction C in FIG. 2 is in parallel to the direction A in FIG. 1, and the direction D in FIG. 2 is in parallel to the direction B in FIG. 1.

Therefore, in this embodiment, the array of pads 9 is arranged along each of the sides S5, S6, S7, and S8, and the adjacent pads 4 in each array of pads 9 will be arranged being shifted in the direction C and in the direction D.

A straight line connecting centers of the multiple pads 4 in the array of pads 9 forms a continuous uneven shape. Here, the convex portion of this embodiment is in the approximately V-shape, and the adjacent convex portions differ from each other in a length L1 in the direction C and in a length L2 in the direction D. Therefore, the adjacent convex portions differ from each other in size, and a large convex portion and a small convex portion continue alternately.

The multiple pads 4 in such an array of pads 9 are electrically coupled with extraction wiring 10 extending toward the outside over the upper surface of the mounting substrate 2. Since the adjacent pads 4 are arranged being shifted in the direction C and in the direction D, it is possible to narrow a space of the adjacent extraction wiring 10 within a range that satisfies a design rule and as a result to increase the number of the extraction wiring 10. In addition, it is possible to increase the number of the pads 4 in the array of pads 9 of the mounting substrate 2 and the number of the bumps 3 in the array of bumps 5 of the package substrate 1 as compared with the case where they are arranged substantially on straight lines. In other words, the electronic device can be miniaturized.

The mounting substrate 2 further has an array of pads 11 corresponding to the array of bumps arranged in the inside of the array of bumps 5, and the array of pads 11 is an array of pads arranged in the inside of the array of pads 9. Moreover, the adjacent pads 4 in the array of pads 11 are also arranged being shifted in the first axial direction that is a normal direction to the side in a plan view and in the second axial direction that intersects perpendicularly with the first axial direction.

That is, in this embodiment, the array of pads 11 is arranged in the inside of each array of pads 9, and the adjacent pads 4 in the array of pads 11 will be arranged being shifted in the direction C and in the direction D. Moreover, a straight line connecting centers of the multiple pads 4 in the array of pads 11 arranged in the inside of the array of pads 9 also forms a continuous uneven shape. Here, the convex portion of this embodiment is in the approximately V-shape, and the adjacent convex portions differ from each other in the length L1 in the direction C and in the length L2 in the direction D. Therefore, the adjacent convex portions differ from each other in size, and a large convex portion and a small convex portion continue alternately.

Thereby, it is possible to increase also the number of the pads 4 in the array of pads 11 of the mounting substrate 2 and the number of the bumps 3 in the array of bumps arranged in the inside of the array of bumps 5 in the package substrate 1, as compared with the case where they are arranged substantially on straight lines. In other words, the electronic device can be miniaturized.

Here, the array of pads 9 and the array of pads 11 are arranged so as to correspond to each other. That is, the straight line connecting the centers of the multiple pads 4 in the array of pads 9 and the straight line connecting the centers of the multiple pads 4 in the array of pads 11 have a substantially equal distance from each other in the first axial direction in any place.

The multiple pads 4 in such an array of pads 11 are electrically coupled with the vias 6 through the wiring 7 formed over the upper surface of the mounting substrate 2. Thereby, even if the extraction wiring 10 of the array of pads being the outermost array is dense and thereby the extraction wiring of the pad 4 of the array of pads 11 cannot be secured over the upper surface of the mounting substrate 2, it is possible to input a signal into the pads of the array of pads 11 and to output it therefrom through the vias 6 and the extraction wiring 8 formed over an undersurface of the mounting substrate 2. Therefore, since it is not necessary, for example, to lay the extraction wiring between the adjacent pads 4 of the array of pads 9, the pads 4 of the array of pads 9 and eventually the bumps 3 of the array of bumps 5 can be densely arranged within a range that satisfies the design rule.

The vias 6 are arranged in a void portion in the mounting substrate 2, as shown in FIG. 2 and FIG. 3. Especially, a predetermined via 6 is arranged between the array of pads 9 and the array of pads 11. This arrangement enables the void part between the array of pads 9 and the array of pads 11 to be utilized effectively, and can contribute to miniaturization of the electronic device.

At this time, it is desirable that the vias 6 are arranged in a concave portion between a large convex portion formed by a line connecting centers of the multiple pads 4 of the array of pads 9 and a large convex portion formed by a line connecting centers of the multiple pads 4 of the array of pads 9 that adjoins that large convex portion. Thereby, a space between the array of pads 9 and the array of pads 11 can be narrowed, which can contribute to miniaturization of the electronic device.

In these package substrate 1 and electronic device, the adjacent bumps 3 (the pads 4) are arranged being shifted in the first axial direction and in the second axial direction, as described above. That is, a line connecting centers of the multiple bumps 3 (the pads 4) of the array of bumps 5 (the array of pads 9) forms a continuous uneven shape in a plan view, and a line connecting centers of the multiple bumps (the pads 4) of the array of bumps (the array of pads 11) arranged in the inside of the array of bumps 5 (the array of pads 9) forms a continuous uneven shape in a plan view. Therefore, it is possible to increase the number of the extraction wiring 10 by narrowing the space of the adjacent extraction wiring 10 within a range that satisfies the design rule. In addition, it is possible to increase the numbers of the pads 4 of the mounting substrate 2 and of the bumps 3 of the package substrate 1.

Moreover, even if the extraction wiring 10 of the array of pads 9 being the outermost array is dense and thereby the extraction wiring 8 of the array of pads 11 cannot be secured, it is possible to input a signal into the pad 4 of the array of pads 11 and to output it therefrom through the via 6 and the extraction wiring 8 formed over the undersurface of the mounting substrate 2. Therefore, since it is not necessary, for example, to lay the wiring between the adjacent pads 4 in the array of pads 9, the pads 4 in the array of pads 9 and eventually the bumps 3 in the array of bumps 5 can be densely arranged within a range that satisfies the design rule. This arrangement can therefore contribute to the miniaturization of the electronic device.

Second Embodiment

A package substrate and an electronic device of a second embodiment will be explained. Incidentally, since the package substrate and the electronic device of this embodiment are made to have substantially the same configurations of the package substrate and the electronic device of the first embodiment, overlapped explanations are omitted and explanations will be given using the same reference symbols for the same components.

Figure 4:
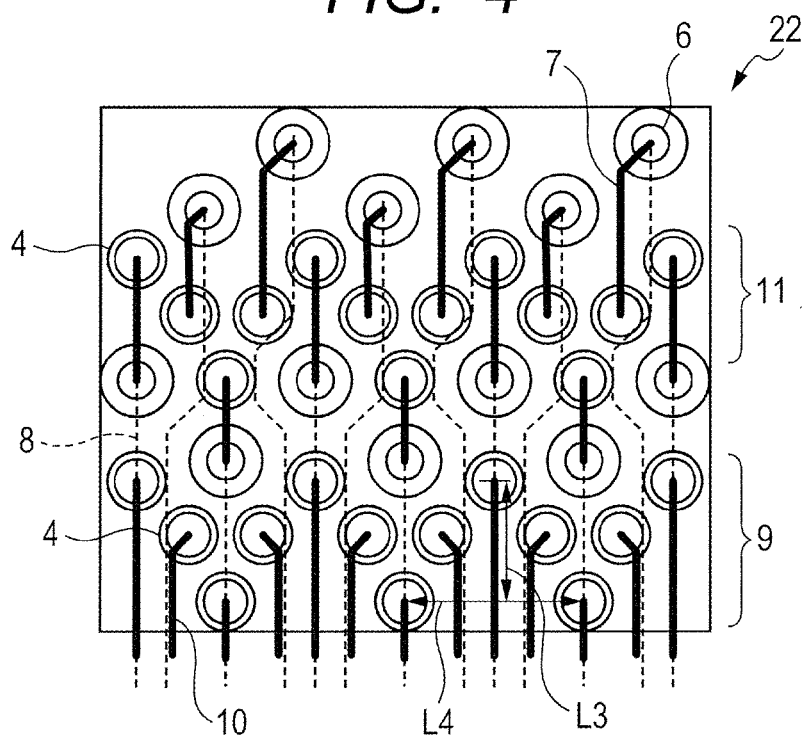
FIG. 4 is a plan view partially showing a mounting substrate according to a second embodiment.

In the package substrate and the electronic device of this embodiment, the line connecting the centers of the multiple bumps in the package substrate and the line connecting the centers of the multiple pads 4 in a mounting substrate 22 each form a shape in which the convex portions whose sizes are substantially equal continue, as shown in FIG. 4. That is, a length L3 of the convex portion in the first axial direction and a length L4 thereof in the second axial direction may be substantially equal between the adjacent convex portions, respectively.

Also in these package substrate and electronic device, the adjacent bumps (the pads 4) are arranged being shifted in the first axial direction and in the second axial direction. That is, the line connecting the centers of the multiple bumps (the pads 4) of the array of bumps 5 (the array of pads 9) forms a continuous uneven shape in a plan view, and the line connecting the centers of multiple bumps (the pads 4) of the array of bumps (the array of pads 11) arranged in the inside of the array of bumps 5 (the array of pads 9) forms a continuous uneven shape in a plan view. Therefore, it is possible to narrow the space of the adjacent extraction wiring 10 within a range that satisfies the design rule and as a result to increase the number of the extraction wiring 10. In addition, the numbers of the pads 4 of the mounting substrate 22 and of the bumps of the package substrate can be increased.

Moreover, even if the extraction wiring 10 of the array of pads 9 being the outermost array is dense and thereby the extraction wiring of the array of pads 11 cannot be secured, it is possible to input a signal into the pad 4 of the array of pads 11 and to output it therefrom through the via 6 and the extraction wiring 8 formed over an undersurface of the mounting substrate 22. Therefore, since it is not necessary, for example, to lay the wiring between the adjacent pads 4 of the array of pads 9, the pads 4 of the array of pads 9 and eventually the bumps 3 of the array of bumps 5 can be densely arranged within a range that satisfies the design rule.

Here, the vias 6 of this embodiment are arranged in a concave portion between adjacent convex portions in multiple convex portions formed by the straight line connecting the centers of the multiple pads 4 of the array of pads 9. Thereby, the space between the array of pads 9 and the array of pads 11 can be narrowed. Therefore, this arrangement can miniaturize the electronic device.

Third Embodiment

A package substrate and an electronic device of a third embodiment will be explained. Incidentally, since the package substrate and the electronic device of this embodiment are made to have substantially the same configurations as those of the package substrate and the electronic device of the first embodiment, overlapped explanations are omitted and explanations will be given using the same reference symbols for the same components.

Figure 5:
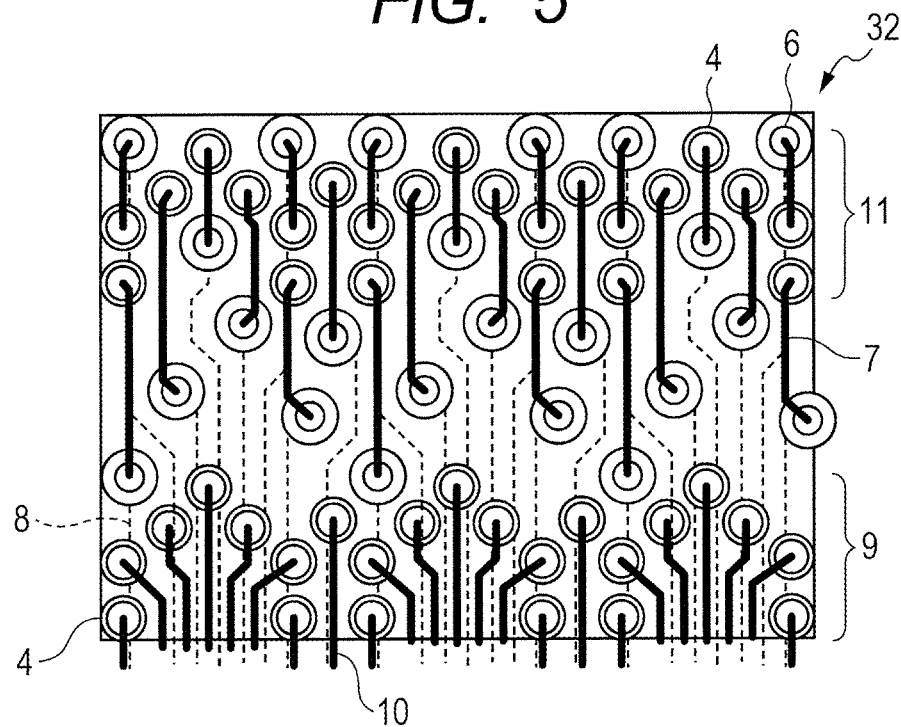
FIG. 5 is a plan view partially showing a mounting substrate according to a third embodiment.

In the package substrate and the electronic device of this embodiment, as shown in FIG. 5, approximately similarly with the package substrate and the electronic device of the first embodiment, a line connecting centers of the multiple bumps in the package substrate and a line connecting centers of the multiple pads 4 in a mounting substrate 32 each form a shape in which large and small convex portions continue, respectively, and the convex portion is made into an approximately U-shape.

Also in such a package substrate and an electronic device, the adjacent bumps (pad 4) are arranged being shifted in the first axial direction and in the second axial direction. That is, the line connecting the centers of the multiple bumps 3 (the pads 4) of the array of bumps 5 (the array of pads 9) forms a continuous uneven shape in a plan view, and the line connecting the centers of the multiple bumps (the pads 4) of the array of bumps (the array of pads 11) arranged in the inside of the array of bumps 5 (the array of pads 9) forms a continuous uneven shape in a plan view. Therefore, it is possible to narrow the space of the adjacent extraction wiring 10 within a range that satisfies the design rule and as a result to increase the number of the extraction wiring 10. In addition, it is possible to increase the numbers of the pads 4 of the mounting substrate 32 and of the bumps of the package substrate.

Moreover, even if the extraction wiring 10 of the array of pads 9 being the outermost array is dense and thereby the extraction wiring of the array of pads 11 cannot be secured, it is possible to input a signal into the pad 4 of the array of pads 11 and to output it therefrom through the via 6 and the extraction wiring 8 formed over an undersurface of the mounting substrate 32. Therefore, since it is not necessary, for example, to lay the wiring between the adjacent pads 4 in the array of pads 9, the pads 4 of the array of pads 9 and eventually the bumps 3 of the array of bumps 5 can be densely arranged within a range that satisfies the design rule.

Here, the vias 6 of this embodiment are arranged in a concave portion between a large convex portion formed by the line connecting the centers of multiple pads 4 of the array of pads 9 and a small convex portion formed by the line connecting the centers of the multiple pads 4 of the array of pads 9 that adjoins that large convex portion. Thereby, the space between the array of pads 9 and the array of pads 11 can be narrowed. Therefore, it can contribute to the miniaturization of the electronic device.

Fourth Embodiment

A package substrate and an electronic device of a fourth embodiment will be explained. Incidentally, since the package substrate and the electronic device of this embodiment are made to have substantially the same configurations as those of the package substrate and the electronic device of the first embodiment, overlapped explanations are omitted and explanations will be given using the same reference symbols for the same components.

Figure 6:
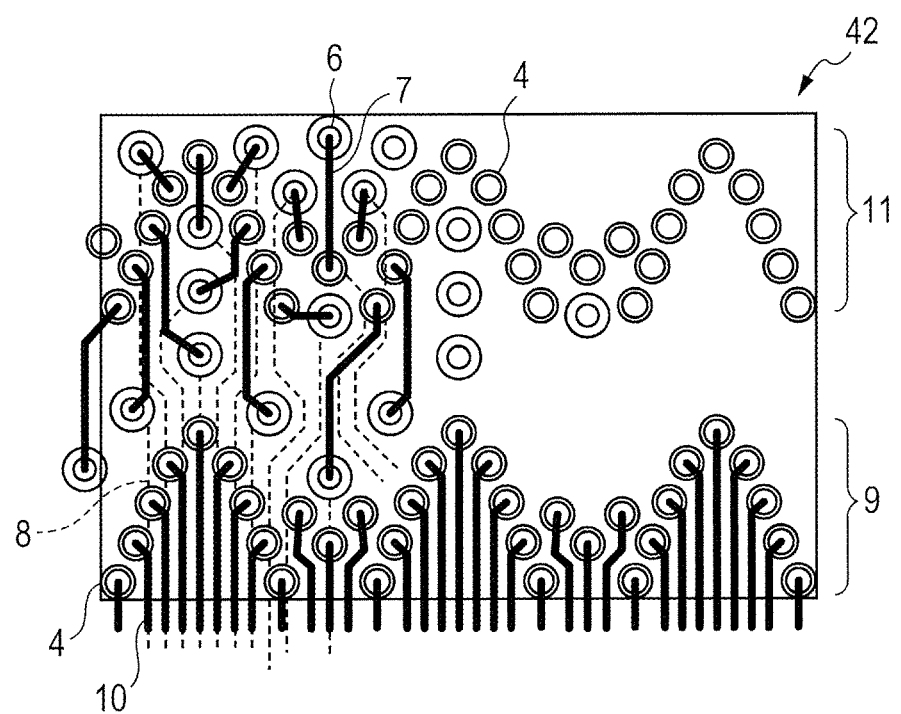
FIG. 6 is a plan view that partially shows a mounting substrate according to a fourth embodiment, and schematically shows it by partially omitting vias and wiring.

In the package substrate and the electronic device of this embodiment, as shown in FIG. 6, approximately similarly with the package substrate and the electronic device of the first embodiment, a line connecting centers of the multiple bumps in the package substrate and a line connecting centers of the multiple pads 4 in a mounting substrate 42 each form a shape in which large and small convex portions continue, respectively, the convex portions are made into a substantially M-shape. Incidentally, in FIG. 6, a partial area of the mounting substrate 42 is shown with the vias and the wiring omitted partially because illustration of all the vias and the whole wiring becomes complicated.

Also in such a package substrate and an electronic device, the adjacent bumps (the pads 4) are arranged being shifted in the first axial direction and in the second axial direction. That is, the line connecting the centers of the multiple bumps (the pads 4) of the array of bumps 5 (the array of pads 9) forms a continuous uneven shape in a plan view, and the line connecting the centers of the multiple bumps (the pads 4) of the array of bumps (the array of pads 11) arranged in the inside of the array of bumps 5 (the array of pads 9) forms a continuous uneven shape in a plan view. Therefore, the number of the extraction wiring 10 can be increased by narrowing the space of the adjacent extraction wiring 10 within a range that satisfies the design rule. In addition, the numbers of the pads 4 of the mounting substrate 42 and of the bumps of the package substrate can be increased.

Moreover, even if the extraction wiring 10 of the array of pads 9 being the outermost array is dense and thereby the extraction wiring of the array of pads 11 cannot be secured, it is possible to input a signal into the pads 4 of the array of pads 11 and to output it therefrom through the via 6 and the extraction wiring 8 formed over an undersurface of the mounting substrate 42. Since this negates a necessity, for example, of laying wiring between the adjacent pads 4 of the array of pads 9, the pads 4 of the array of pads 9 and eventually the bumps 3 of the array of bumps 5 can be densely arranged within a range that satisfies the design rule.

Here, the vias 6 of this embodiment are arranged in a concave portion between a large convex portion formed by the line connecting the centers of the multiple pads 4 of the array of pads 9 and a large convex portion formed by the line connecting the centers of the multiple pads 4 of the array of pads 9 that adjoins that large convex portion. Thereby, the space between the array of pads 9 and the array of pads 11 can be narrowed. Therefore, it can contribute to the miniaturization of the electronic device.

Comparative Example

Here, the following numbers in the case where the package substrates of the above-mentioned embodiments 1 to 4 are used will be verified: the number of pads (bumps) per unit area that can be extracted from the upper surface and undersurface of the mounting substrate; and the number of pads (bumps) that can be extracted from the upper surface of the mounting substrate. Here, the package substrate to be mounted over the mounting substrate shown in FIG. 3 to FIG. 6 in this embodiment and the package substrate to be mounted over the mounting substrate shown in FIG. 7 to FIG. 9, as a comparative example, are compared.

Incidentally, the mounting substrate shown in FIG. 3 to FIG. 9 is a partial area extracted from its periphery, and this area is an extracted area into/from which a signal can be inputted from and outputted into both the multiple pads of the array of pads being the outermost array and the multiple pads of the array of pads arranged in the inside of that array of pads.

Here, the mounting substrate 2 shown in FIG. 3 is the mounting substrate of the first embodiment, and the mounting substrate 22 shown in FIG. 4 is the mounting substrate of the second embodiment. Moreover, the mounting substrate 32 shown in FIG. 5 is the mounting substrate of the third embodiment, and the mounting substrate 42 shown in FIG. 6 is the mounting substrate of the fourth embodiment.

Figure 7:
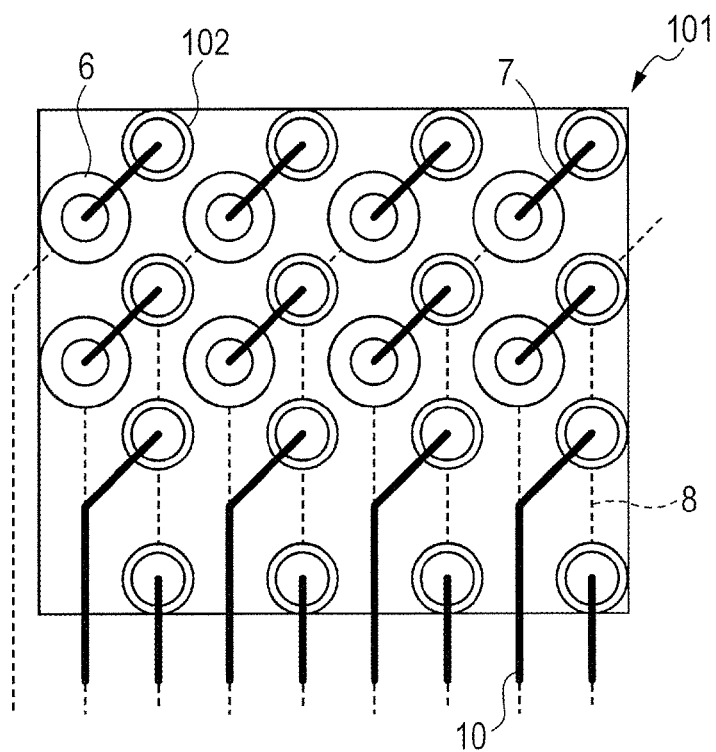
FIG. 7 is a plan view partially showing a mounting substrate of a comparative example.

In a mounting substrate 101 shown in FIG. 7, pads 102 are arranged so as to correspond to bumps arranged in a grid form like a general package substrate, and correspond to the bumps arranged in a 0.8 mm pitch.

Figure 8:
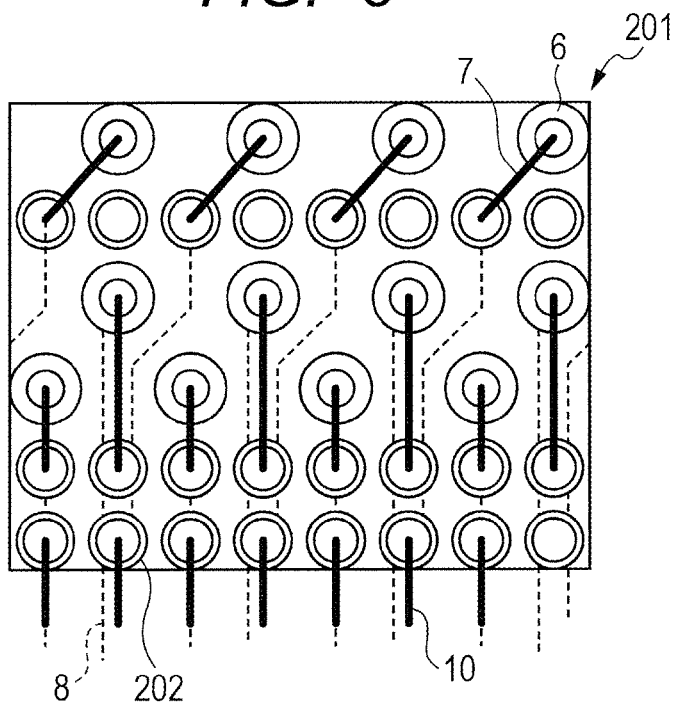
FIG. 8 is a plan view partially showing the mounting substrate of the comparative example.

Also in a mounting substrate 201 shown in FIG. 8, pads 202 are arranged so as to correspond to bumps arranged in a grid form like the general package substrate, and correspond to the bumps arranged in a 0.5 mm pitch.

Figure 9:
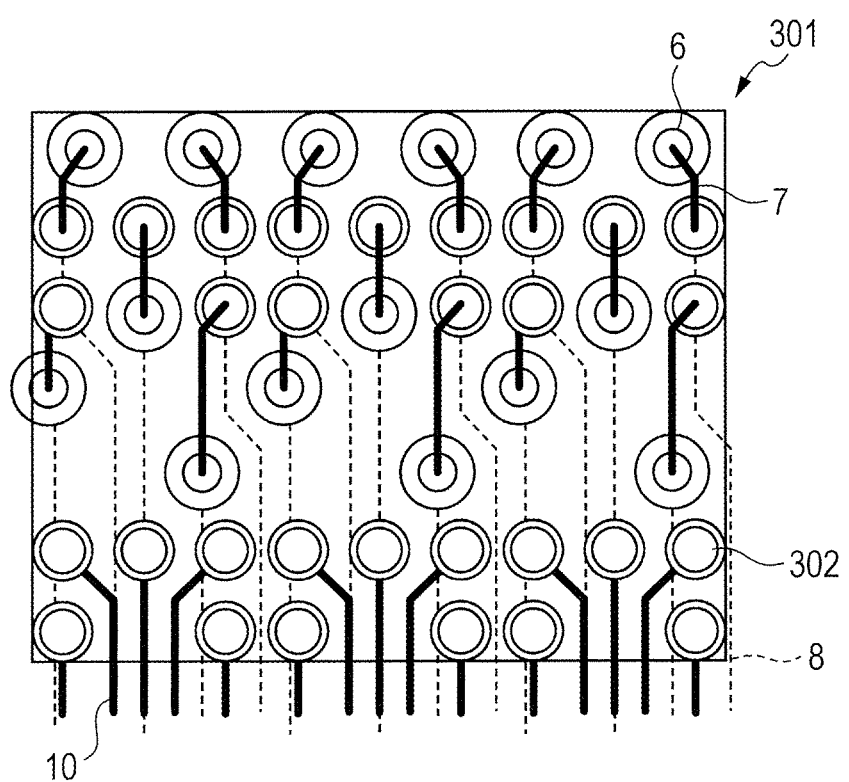
FIG. 9 is a plan view partially showing the mounting substrate of the comparative example.

In a mounting substrate 301 shown in FIG. 9, pads 302 are arranged so as to correspond to bumps of a package substrate disclosed by the above-mentioned U.S. Pat. No. 7,009,115.

Moreover, the mounting substrates shown in FIG. 3 to FIG. 9 are configured to have a common design rule. As the design rule, what are shown in FIG. 10 to FIG. 15 can be exemplified.

Figure 10:
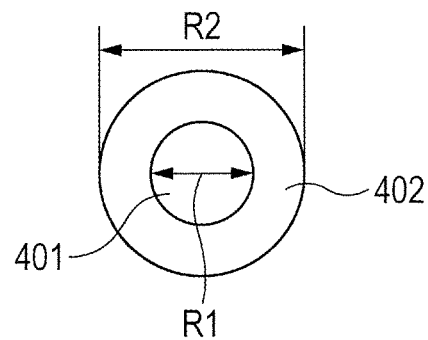
FIG. 10 is a diagram for explaining one example of a design rule.

The design rule shown in FIG. 10 is a design rule of a via 401 formed in the mounting substrate, and in the figure, R1 is a diameter of a drill for the via 401 and R2 is a diameter of a conductor pad 402 into which the drill for the via 401 is inserted.

Figure 11:
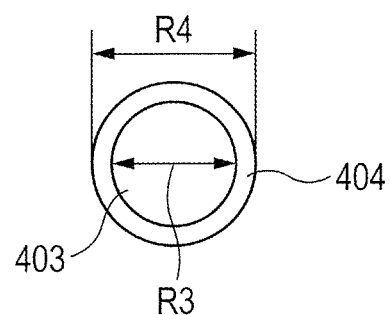
FIG. 11 is a diagram for explaining one example of the design rule.

The design rule shown in FIG. 11 is a design rule of the pads 403 formed over the mounting substrate in order to electrically couple the bumps of the package substrate, and in the figure, R3 is a diameter of a pad 403 and R4 is a diameter of a portion 404 of the pad 403 whose substrate surface is not covered with a protective material (a resist opening etc.).

Figure 12:
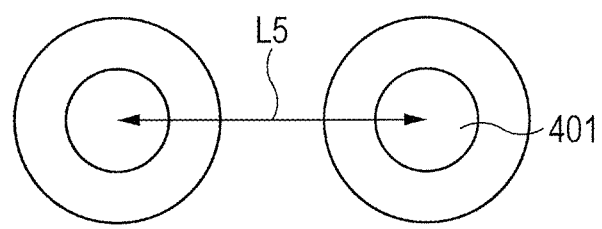
FIG. 12 is a diagram for explaining one example of the design rule.

The design rule shown in FIG. 12 is a design rule of a space of adjacent vias 401, and in the figure, L5 is a space between centers of the adjacent vias 401.

Figure 13:
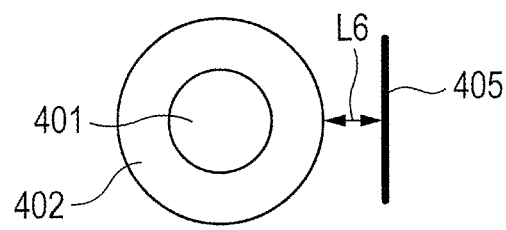
FIG. 13 is a diagram for explaining one example of the design rule.

The design rule shown in FIG. 13 is a design rule of a space between the via 401 and wiring 405, and in the figure, L6 is a space between the conductor pad 402 into which the drill for the via 401 is inserted and the wiring 405.

Figure 14:
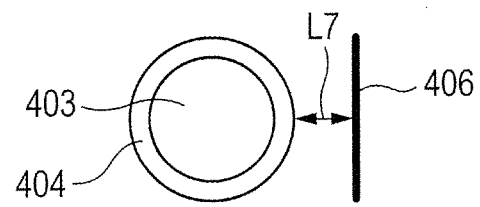
FIG. 14 is a diagram for explaining one example of the design rule.

The design rule shown in FIG. 14 is a design rule of a space between the pad 403 and wiring 406, and in the figure, L7 is a space between a portion 404 of the pad 403 whose substrate surface is not covered with the protective material (the resist opening etc.) and the wiring 406.

Figure 15:
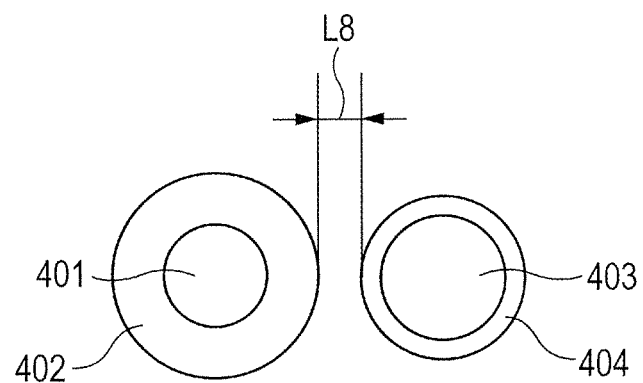
FIG. 15 is a diagram for explaining one example of the design rule.

The design rule shown in FIG. 15 is a design rule of a space between the via 401 and the pad 403, and in the figure, L8 is a space between the conductor pad 402 into which the drill for the via 401 is inserted and the portion 404 of the pad 403 whose substrate surface is not covered with the protective material (the resist opening etc.).

Thus, in the extracted area of the mounting substrate shown in FIG. 3 to FIG. 9, the number of bumps (pads) per unit area each capable of inputting and outputting a signal from/into the upper surface and undersurface of the mounting substrate through the extraction wiring is computed and is shown in FIG. 16, and the number of the bumps (pads) per unit area each capable inputting/outputting a signal from/into the upper surface of the mounting substrate through the extraction wiring is computed and is shown in FIG. 17.

As shown in FIG. 16, the mounting substrate shown in FIG. 3 and FIG. 4 has a large number of pads (per unit area) each capable of inputting/outputting a signal from/into the upper surface and undersurface of the mounting surface through the extraction wiring as compared with that of other mounting substrates, and is suitable to be adopted, for example, for Personal Computer Memory Card International Association (PCMCIA) interface with which a user would like to secure many signal paths not only over the upper surface of the mounting substrate but also over the undersurface, and the like.

Moreover, as shown in FIG. 17, the mounting substrate shown in FIG. 3, FIG. 5, and FIG. 6 has a large number of bumps (pads) per unit area each capable of inputting/outputting a signal from/into the upper surface of the mounting substrate through the extraction wiring as compared with other mounting substrates, and is suitable for adoption in a case where there exist many high-speed interfaces, such as HDMI and PCI Express, in functions of the electronic device.

In the foregoing, although the invention made by these inventors was concretely explained based on the embodiments, the present invention is not limited to the above-mentioned embodiments, and it goes without saying that it can be modified variously within a range that does not deviate from the gist thereof.

For example, although in the above-mentioned embodiments, all the adjacent pumps (the pads) in the array of bumps (the array of pads) are arranged being shifted in the first axial direction and in the second axial direction, what is necessary is just to arrange at least a part of the adjacent bumps (the pads) being shifted in the first axial direction and in the second axial direction.

For example, although in the above-mentioned embodiments, two arrays of the bumps (two arrays of the pads) were arranged with a space being set therebetween in the first axial direction, at least two arrays of bumps should just be arranged and the number of arrangements of the array of bumps (the array of pads) is not restricted.

What is claimed is:

1. A package substrate, comprising:
a first array of bumps that is an outermost array arranged along a first side of the package substrate, adjacent bumps of the first array of bumps being shifted in relation to respective adjacent bumps in a first axial direction that is a normal direction of the first side and in a second axial direction that intersects perpendicularly with the first axial direction in a plan view; and
a second array of bumps arranged in the inside of the first array of bumps, a plurality of bumps of the second array of bumps being shifted in relation to all respective adjacent bumps to the plurality of bumps in the first axial direction and in the second axial direction in a plan view.

2. The package substrate according to claim 1, wherein a line connecting centers of a plurality of bumps in the first array of bumps is of a continuous uneven shape.

3. The package substrate according to claim 2, wherein a line connecting centers of a plurality of bumps in the second array of bumps is of a continuous uneven shape.

4. The package substrate according to claim 1, wherein the package substrate is mounted over a mounting substrate over which five or more pads corresponding to the bumps of the first array of bumps are arranged so as to surround a via.

5. An electronic device comprising:
the package substrate according to claim 1; and
a mounting substrate over which pads are arranged so as to correspond to the bumps of the package substrate.

6. A package substrate, comprising:
a first array of bumps that is an outermost array arranged along a first side of the package substrate, adjacent bumps of the first array of bumps being shifted in a first axial direction that is a normal direction of the first side and in a second axial direction that intersects perpendicularly with the first axial direction in a plan view; and
a second array of bumps arranged in the inside of the first array of bumps, adjacent bumps of the second array of bumps being shifted in the first axial direction and in the second axial direction in a plan view,
wherein a line connecting centers of a plurality of bumps in the first array of bumps is of a continuous uneven shape,
a line connecting centers of a plurality of bumps in the second array of bumps is of a continuous uneven shape, and
a space between the line connecting the centers of the bumps in the first array of bumps and the line connecting the centers of the bumps in the second array of bumps have a substantially equal distance from each other in the first axial direction in any place.

7. A package substrate, comprising:
a first array of bumps that are an outermost array; and
a second array of bumps arranged in the inside of the first array of bumps,
wherein a line connecting centers of a plurality of bumps in the first array of bumps forms a continuous uneven shape in a plan view, and
wherein a line connecting centers of a plurality of bumps in the second array of bumps in relation to all respective adjacent bumps to the plurality of bumps forms a continuous uneven shape in a plan view.

8. An electronic device comprising:
a package substrate, comprising:
a first array of bumps that is an outermost array arranged along a first side of the package substrate, adjacent bumps of the first array of bumps being shifted in a first axial direction that is a normal direction of the first side and in a second axial direction that intersects perpendicularly with the first axial direction in a plan view, and
a second array of bumps arranged in the inside of the first array of bumps, adjacent bumps of the second array of bumps being shifted in the first axial direction and in the second axial direction in a plan view; and
a mounting substrate over which pads are arranged so as to correspond to the bumps of the package substrate, the mounting substrate including:
a first array of pads that corresponds to a first array of bumps being the outermost array in the package substrate and is formed over one major surface of the mounting substrate,
a second array of pads that corresponds to a second array of bumps arranged in the inside of the first array of bumps of the package substrate and is formed over the one major surface of the mounting substrate,
first extraction wiring that is electrically coupled to the pads of the first array of pads and is formed over the one major surface of the mounting substrate,
a via electrically coupled to the pad of the second array of pads through the wiring formed over the one major surface of the mounting substrate, and
second extraction wiring that is electrically coupled to the via and is formed over the other major surface of the mounting substrate.

9. The electronic device according to claim 8, wherein the via is arranged between the first array of pads and the second array of pads.

10. The electronic device according to claim 9, wherein the via is arranged in a concave portion between the adjacent convex portions in a plurality of convex portions formed by a line connecting centers of the pads in the first array of pads.

11. The electronic device according to claim 8, wherein the five or more pads are arranged so as to surround the via.

* * * * *